United States Patent
Fan

(10) Patent No.: US 8,292,093 B2
(45) Date of Patent: Oct. 23, 2012

(54) RACK FRAME ASSEMBLY

(75) Inventor: Chen-Lu Fan, Tu-Cheng (TW)

(73) Assignee: Hon Hai Precision Industry Co., Ltd., Tu-Cheng, New Taipei (TW)

( * ) Notice: Subject to any disclaimer, the term of this patent is extended or adjusted under 35 U.S.C. 154(b) by 36 days.

(21) Appl. No.: 13/027,485

(22) Filed: Feb. 15, 2011

(65) Prior Publication Data

US 2012/0024811 A1    Feb. 2, 2012

(30) Foreign Application Priority Data

Jul. 28, 2010   (CN) .......................... 2010 1 0239196

(51) Int. Cl.
*F16B 7/04* (2006.01)

(52) U.S. Cl. .......................... 211/26; 312/265.4; 403/170

(58) Field of Classification Search .................... 211/26, 211/182, 183, 189, 190, 191, 192, 193; 312/223.1, 312/265.1–265.4; 403/169, 170, 171, 175, 403/176; 411/424; 52/655.1

See application file for complete search history.

(56) References Cited

U.S. PATENT DOCUMENTS

| | | | | |
|---|---|---|---|---|
| 2,904,360 A * | 9/1959 | Gamlen | ........................ | 403/22 |
| 3,089,716 A * | 5/1963 | Berkowitz | .................... | 403/13 |
| 3,396,996 A * | 8/1968 | Raptis | ....................... | 403/408.1 |
| 3,858,989 A * | 1/1975 | Field | ............................. | 403/171 |
| 3,901,613 A * | 8/1975 | Andersson | ................... | 403/178 |
| 4,045,104 A * | 8/1977 | Peterson | .................... | 312/265.4 |
| 4,299,508 A * | 11/1981 | Kerscher et al. | ............. | 403/172 |
| 4,323,319 A * | 4/1982 | Adams | ......................... | 403/171 |
| 4,353,661 A * | 10/1982 | Ruther | ......................... | 403/171 |
| 4,368,998 A * | 1/1983 | Pestoor | ........................ | 403/171 |
| 4,413,570 A * | 11/1983 | Haigh | ....................... | 108/158.13 |
| 4,630,550 A * | 12/1986 | Weitzman | ..................... | 108/155 |
| 4,691,970 A * | 9/1987 | Neri | ............................ | 312/265.5 |
| 4,726,701 A * | 2/1988 | Thomas | ....................... | 403/172 |
| 4,844,648 A * | 7/1989 | Fentiman | ..................... | 403/171 |
| 4,869,380 A * | 9/1989 | Metcalfe et al. | ............. | 211/189 |
| 4,900,108 A * | 2/1990 | Tischer | ...................... | 312/265.3 |
| 5,033,901 A * | 7/1991 | Dias | ............................. | 403/172 |
| 5,066,161 A * | 11/1991 | Pinney | ......................... | 403/172 |
| 5,228,762 A * | 7/1993 | Mascrier | ................... | 312/265.4 |
| 5,516,225 A * | 5/1996 | Kvols | ........................... | 403/170 |
| 5,590,974 A * | 1/1997 | Yang | ............................ | 403/327 |
| 5,695,263 A * | 12/1997 | Simon et al. | ............... | 312/265.4 |
| 5,820,289 A * | 10/1998 | Kern et al. | .................... | 403/231 |
| 5,873,480 A * | 2/1999 | Wells, Jr. | ..................... | 220/4.02 |
| 6,039,420 A * | 3/2000 | Besserer et al. | ........... | 312/265.1 |
| 6,270,283 B1 * | 8/2001 | Turati | .......................... | 403/217 |
| 6,299,268 B1 * | 10/2001 | Carle et al. | ................. | 312/265.4 |

(Continued)

*Primary Examiner* — Darnell Jayne
*Assistant Examiner* — Joshua Rodden
(74) *Attorney, Agent, or Firm* — Altis Law Group, Inc.

(57) ABSTRACT

A rack frame assembly includes a first frame pole, a second frame pole, a linking member, linking post, and a support pole. A first frame pole includes a first support wall and a first through hole. The second frame pole includes a second support wall. The second frame pole is assembled with the first frame pole with the first support wall and the second support wall located on the same plane. The linking member is located on the first support wall and the second support wall. The linking member includes a second through hole in alignment with the first through hole, and an insert portion. The linking post is located in the first through hole and the second through hole to secure the linking member to the first frame pole. The support pole includes an insert hole with the insert portion located therein.

13 Claims, 7 Drawing Sheets

U.S. PATENT DOCUMENTS

| | | | |
|---|---|---|---|
| 6,315,132 B1* | 11/2001 | Hartel et al. | 211/26 |
| 6,332,657 B1* | 12/2001 | Fischer | 312/111 |
| 6,379,074 B1* | 4/2002 | Chin et al. | 403/231 |
| 6,516,955 B1* | 2/2003 | Dudhwala et al. | 211/26 |
| 6,688,712 B2* | 2/2004 | Adams et al. | 312/265.1 |
| 6,712,434 B2* | 3/2004 | Knab et al. | 312/265.4 |
| 6,811,231 B1* | 11/2004 | Fontana et al. | 312/265.1 |
| 6,881,005 B2* | 4/2005 | Sosa | 403/395 |
| 6,902,068 B1* | 6/2005 | Fontana et al. | 211/26 |
| 7,267,229 B2* | 9/2007 | Chen | 206/600 |
| 7,334,377 B2* | 2/2008 | Dubensky et al. | 52/780 |
| 8,091,970 B2* | 1/2012 | Francisquini | 312/265.1 |
| 8,152,403 B2* | 4/2012 | Shen | 403/171 |
| 2001/0037988 A1* | 11/2001 | Knab et al. | 211/189 |
| 2008/0218042 A1* | 9/2008 | Hartel et al. | 312/265.4 |
| 2010/0314982 A1* | 12/2010 | Luo | 312/351.1 |
| 2011/0309046 A1* | 12/2011 | Lee | 211/182 |
| 2012/0012543 A1* | 1/2012 | Fan | 211/26 |
| 2012/0024811 A1* | 2/2012 | Fan | 211/183 |

\* cited by examiner

RACK FRAME ASSEMBLY

BACKGROUND

1. Technical Field

The present disclosure relates to a rack frame assembly for supporting servers.

2. Description of Related Art

A typical rack frame assembly for supporting servers usually includes two rectangular frames and four support poles connected between the two rectangular frames. Each of the support poles includes a bar for fixing peripheral devices. Each of the frames includes a first frame pole and a second frame pole, perpendicularly connected to the first frame pole. The corners of the first and second frame poles and the support pole are welded together to assemble the rack frame assembly. However, it is often inconvenient to disassemble the rack frame assembly after the first and the second frame poles are welded together with the support pole.

Therefore, there is room for improvement within the art.

BRIEF DESCRIPTION OF THE DRAWINGS

Many aspects of the embodiments can be better understood with references to the following drawings. The components in the drawings are not necessarily drawn to scale, the emphasis instead being placed upon clearly illustrating the principles of the embodiments. Moreover, in the drawings, like reference numerals designate corresponding parts throughout the several views.

DETAILED DESCRIPTION

The disclosure is illustrated by way of example and not by way of limitation in the figures of the accompanying drawings in which like references indicate similar elements. It should be noted that references to "an" or "one" embodiment in this disclosure are not necessarily to the same embodiment, and such references mean at least one.

Figure 1:
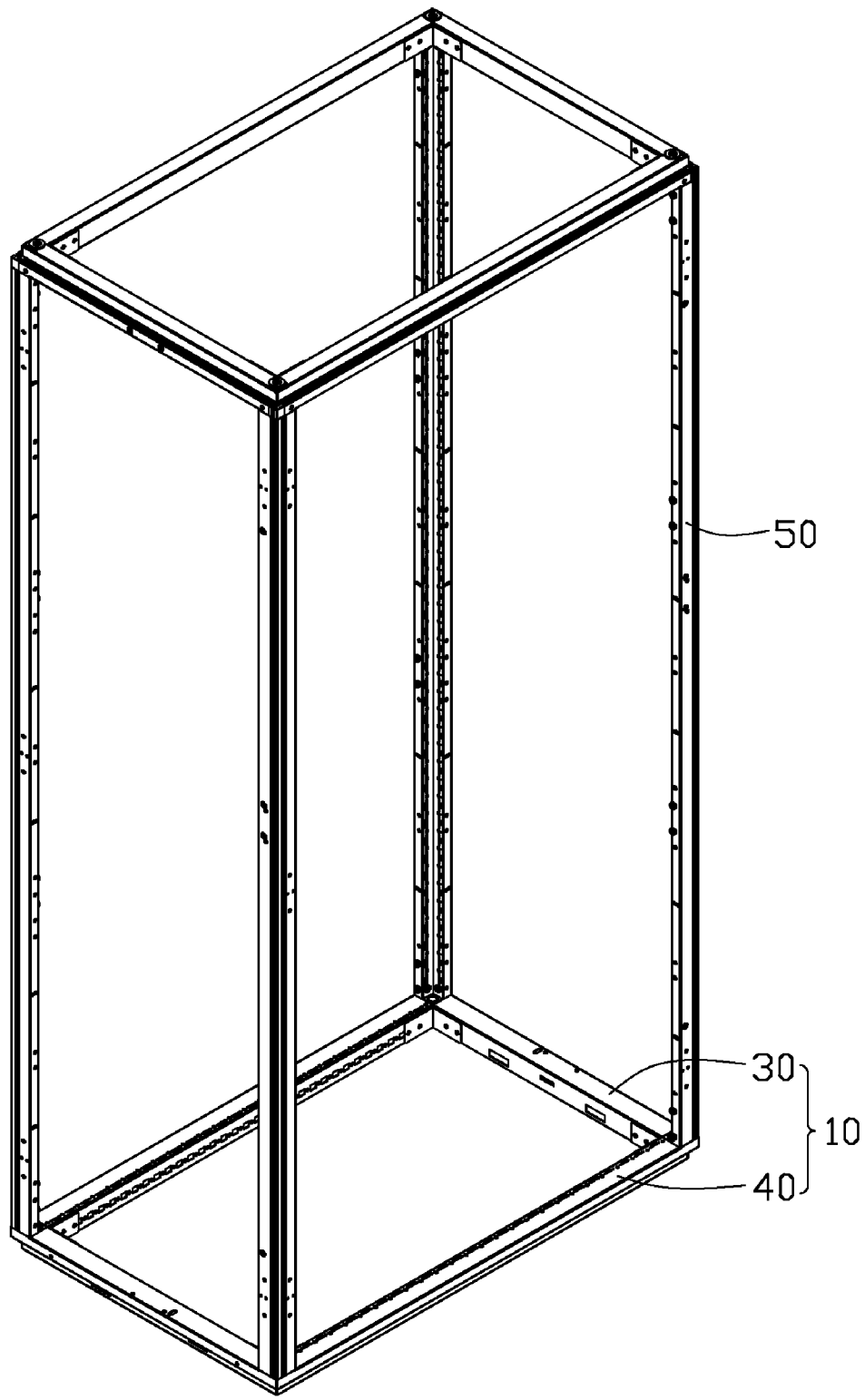
FIG. 1 is an isometric view of a rack frame assembly in accordance with one embodiment.
Figure 2:
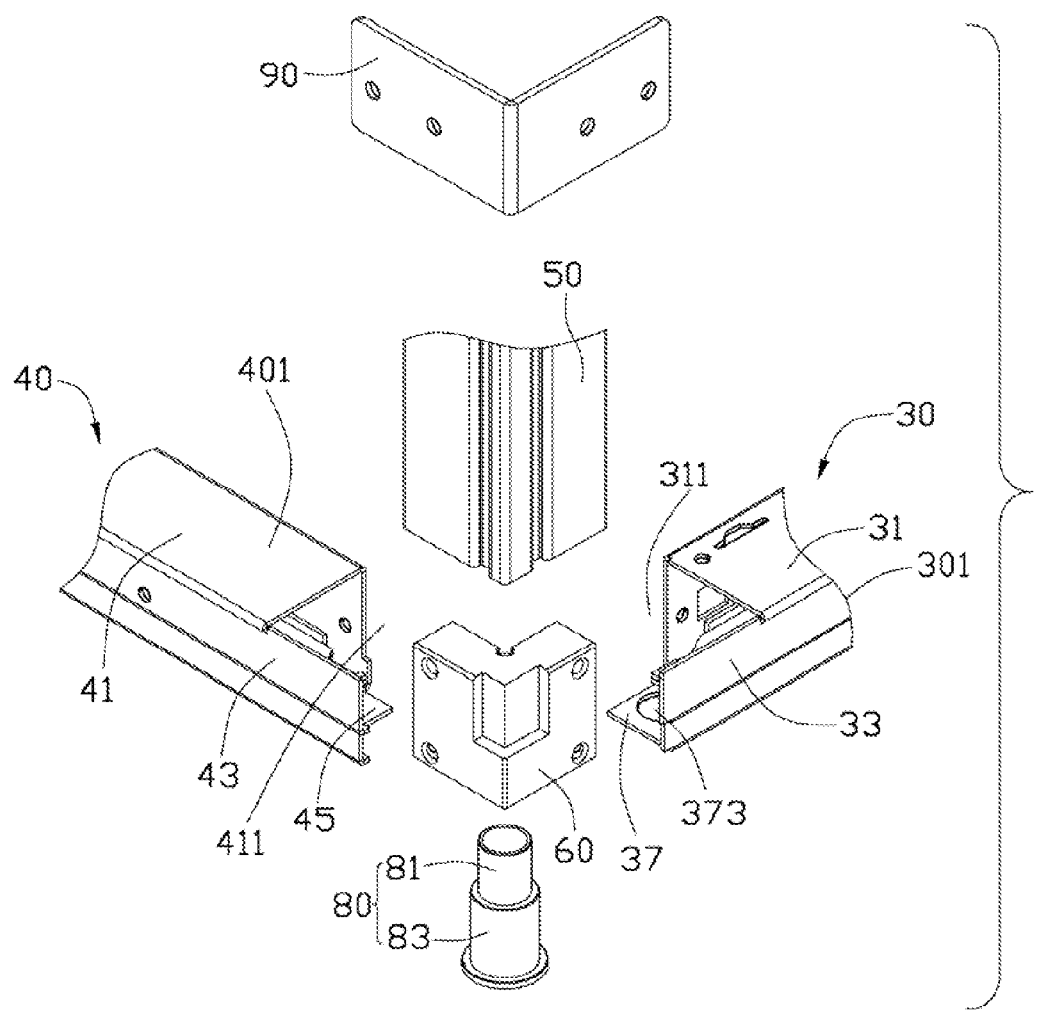
FIG. 2 is an isometric and exploded view of a corner of the rack frame assembly of FIG. 1.
Figure 3:
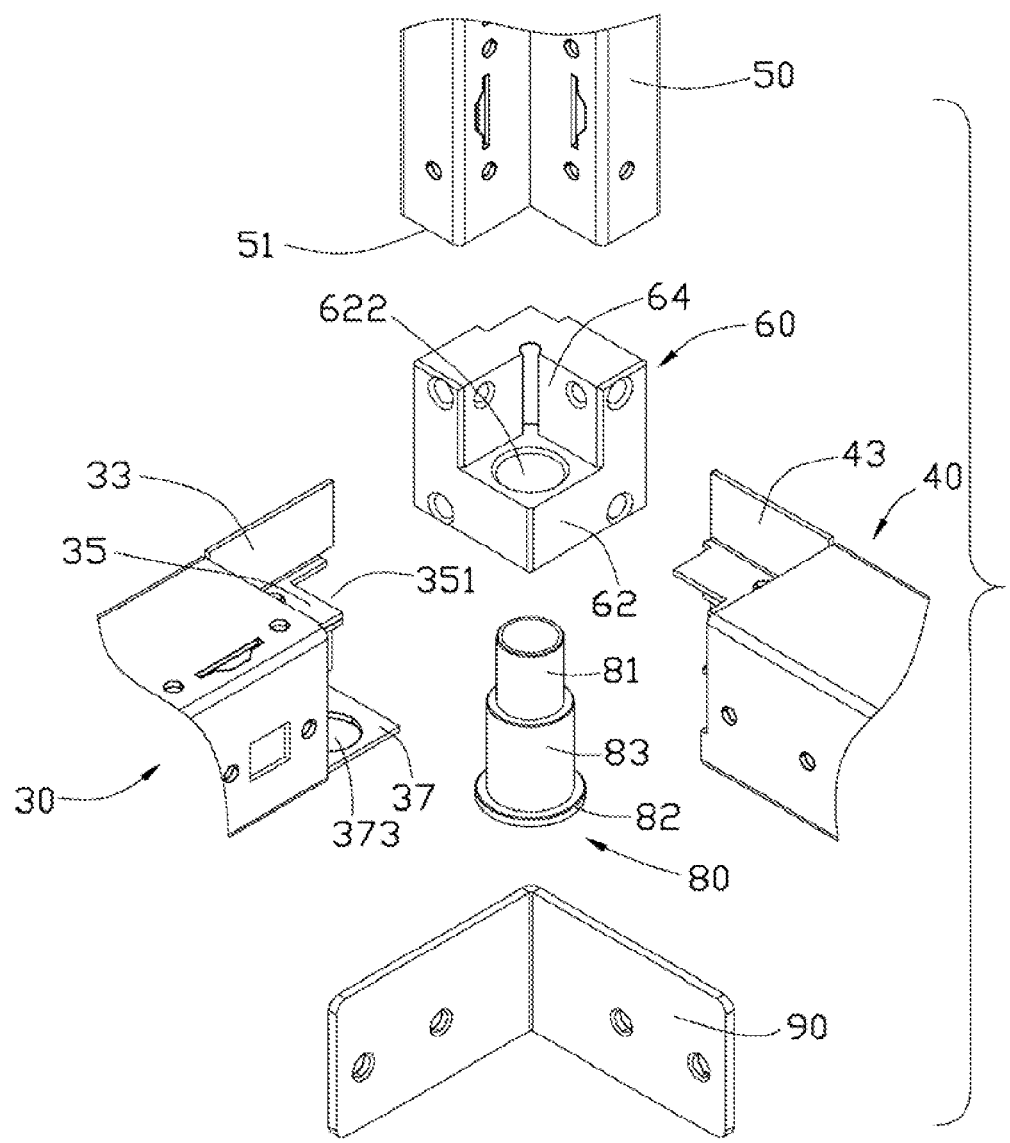
FIG. 3 is similar to FIG. 2, but viewed from another aspect.
Figure 4:
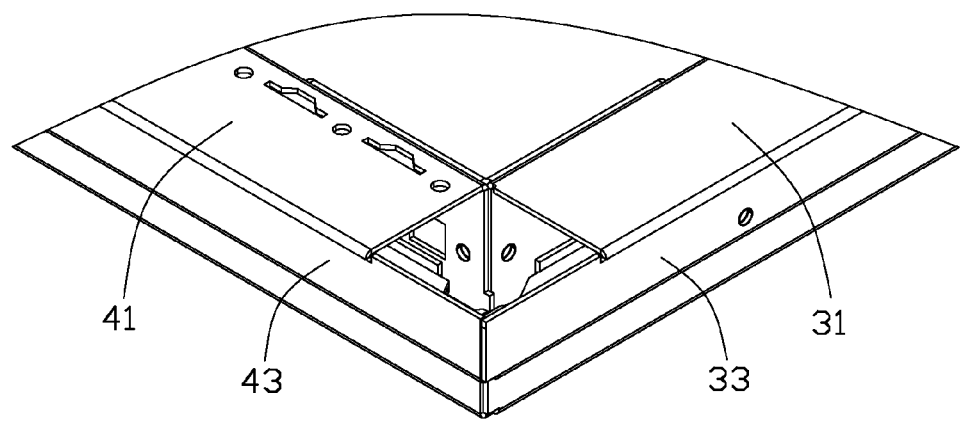
FIG. 4 is an assembled view of a first frame pole and a second frame pole of FIG. 2.
Figure 5:
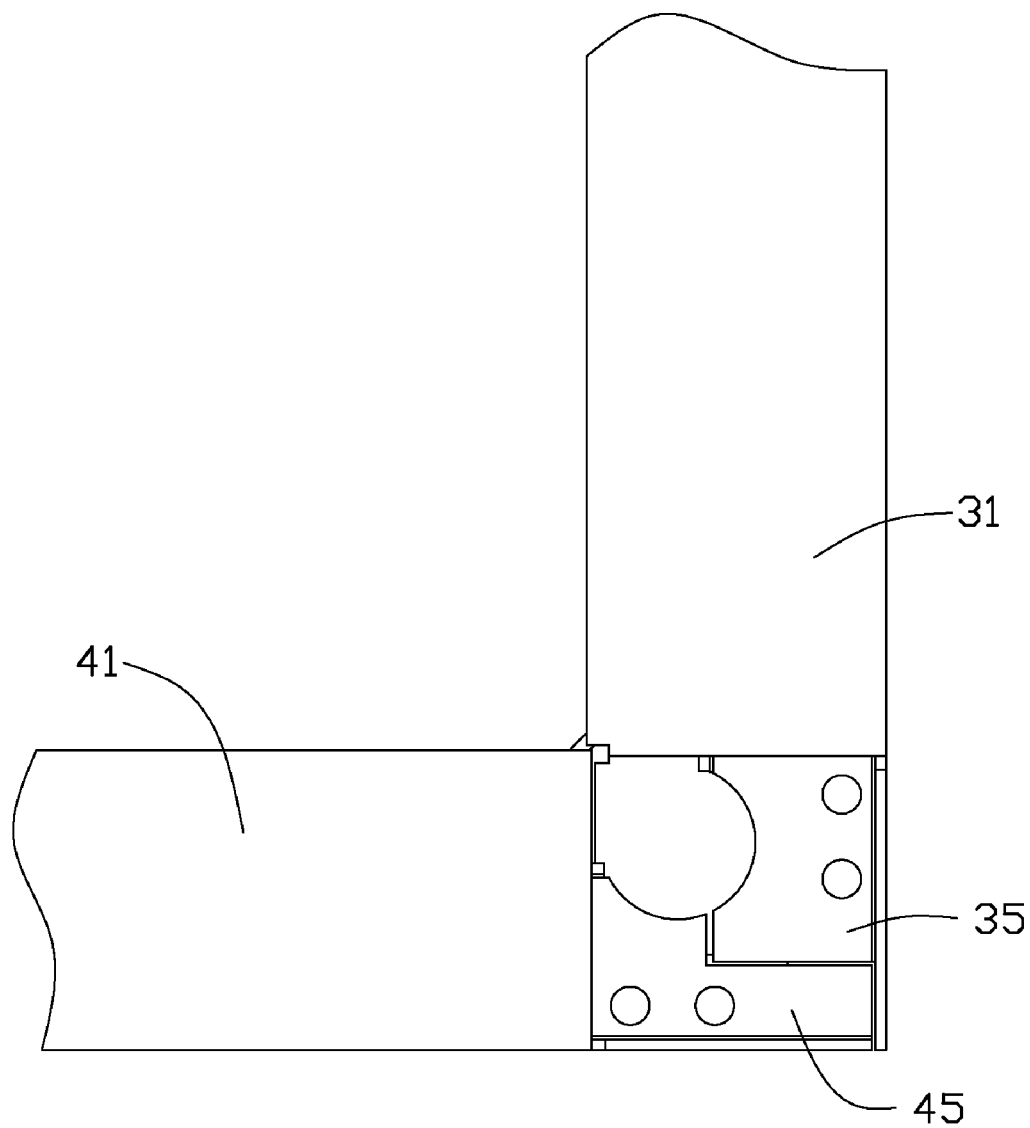
FIG. 5 is a vertical view of the first frame pole and the second frame pole of FIG. 4.
Figure 6:
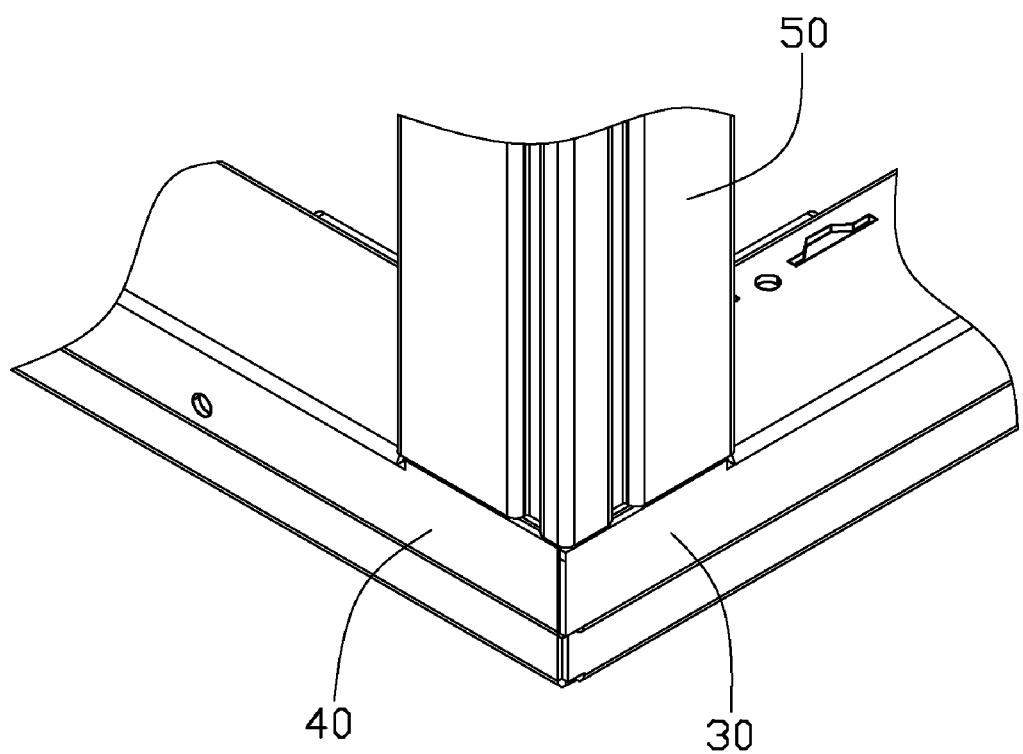
FIG. 6 is an assembled view of the corner of FIG. 2.
Figure 7:
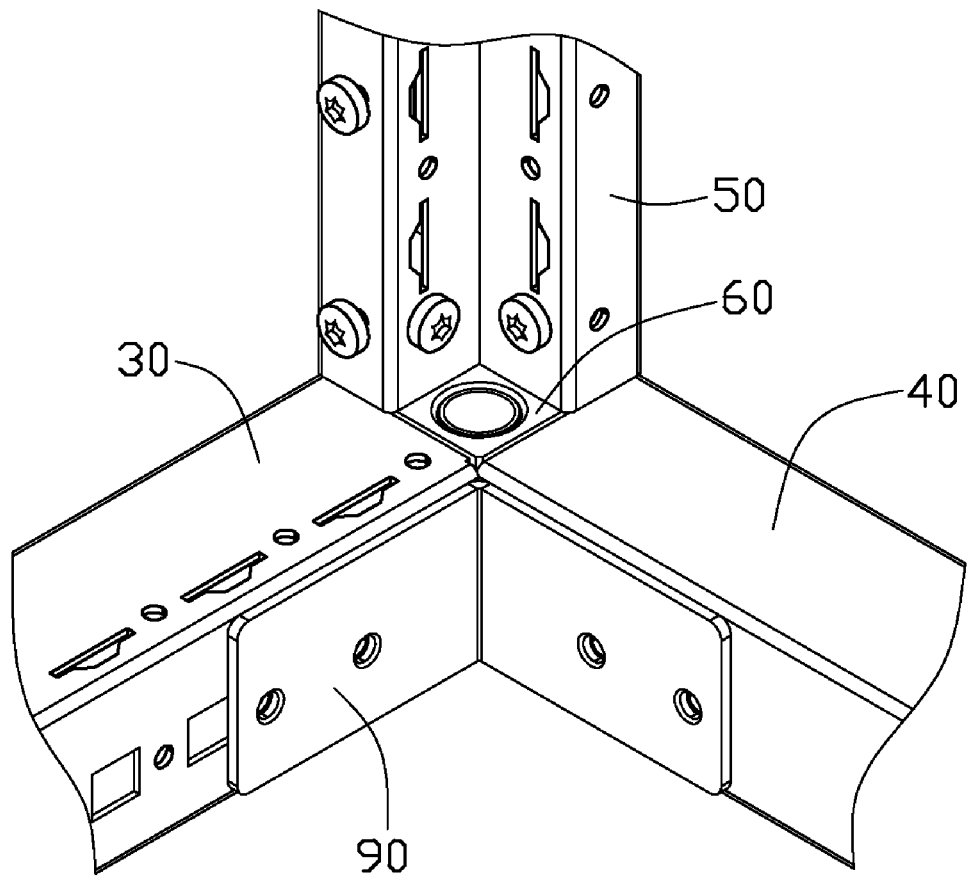
FIG. 7 is an assembled view of a corner of FIG. 3.

Referring to FIGS. 1, 2, and 3, a rack frame assembly in one embodiment includes two rectangular rack frames 10 and four support poles 50 connected to corners of the two rectangular rack frames 10.

Each rectangular rack frame 10 includes a first frame pole 30 and a second frame pole 40. The first frame pole 30 includes a first end 301. The second frame pole 40 includes a second end 401, which is connected to the first end 301 of the first frame pole 30. The first end 301 includes a first top wall 31, a first bottom wall 37 parallel to the first top wall 31, and a first side wall 33 connected between the first bottom wall 37 and the first top wall 31. A first support wall 35 is connected to a middle portion of the first side wall 33. The first support wall 35 is parallel to the first top wall 31. A first through hole 373 is defined in the first bottom wall 37. A second cutout 351 is defined on the first support wall 35. The second cutout 351 is in alignment with the first through hole 373. A first cutout 311 is defined on the first top wall 31. The first cutout 311 is aligned with the first support wall 35.

The second end 401 of the second frame pole 40 includes a second top wall 41, and a second side wall 43 perpendicularly connected to the second top wall 41. A second support wall 45 is connected to the second side wall 43, and located parallel to the second top wall 41. The second top wall 41 defines a third cutout 411, which is in alignment with the second support wall 45.

A linking member 60 is configured to be mounted between the first end 301 and the second end 401. The linking member 60 includes a base 62 and an "L"-shaped insert portion 64 connected to the base 62. A second through hole 622 is defined in the base 62. A diameter of the second through hole 622 is smaller than that of the first through hole 373.

A linking post 80 is configured to be mounted in the first through hole 373 and the second through hole 622. The linking post 80 includes a head 82, a first post portion 83, and a second post portion 81. A diameter of the head 82 is larger than that of the first through hole 373. A diameter of the first post portion 83 is substantially equal to that of the first through hole 373. A diameter of the second post portion 81 is substantially equal to that of the second through hole 622.

The support pole 50 includes a "L"-shaped insert hole 51 for receiving the insert portion 64 inserted therein.

Referring to FIGS. 1 to 7, in assembly of rack frame assembly, the first end 301 of the first frame pole 30 is aligned with the second end 401 of the second frame pole 40. In this position, the first support wall 35 and the second support wall 45 are located on the same plane. A bent piece 90 is mounted to a junction portion of the first frame pole 30 and the second frame pole 40 to help secure the first frame pole 30 and the second frame pole 40 together. The linking member 60 is placed on the first support wall 35 and the second support wall 45 with the second through hole 622 aligned with the first through hole 373. The linking post 80 is inserted in the first through hole 373 and the second through hole 622. The first portion 83 is located in the first through hole 373. The second post portion 81 is located in the second through hole 622. The head 82 abuts against the first bottom wall 37, and is secured on the first bottom wall 37. The insert portion 64 of the linking member 60 is inserted in the insert hole 51 of the support pole 50 to secure the support pole 50 together. Therefore, the rack frame assembly is assembled.

It is to be understood, however, that even though numerous characteristics and advantages of the embodiments have been set forth in the foregoing description, together with details of the structure and function of the embodiments, the disclosure is illustrative only, and changes may be made in detail, especially in matters of shape, size, and arrangement of parts within the principles of the present disclosure to the full extent indicated by the broad general meaning of the terms in which the appended claims are expressed.

What is claimed is:

1. A rack frame assembly, comprising:
a first frame pole comprising a first top wall and a first support wall, the first top wall and the first support wall are separated from each other and parallel to each other, the first top wall is located above the first support wall, and the first frame pole defines a first through hole, which is located below the first support wall; and the first top wall defines a first cutout, the first supporting wall defines a second cutout; and the first cutout and the second cutout are aligned with the first through hole to expose the first through hole;
a second frame pole comprising a second top wall and a second support wall, the second top wall defines a third cutout, the second frame pole is perpendicularly connected to the first frame pole, and the first support wall and the second support wall are located in a first plane, the first top wall and the second top wall are located in a second plane which is located above the first plane;

a linking member comprising a base and an insert portion connected to the base, the base defines a second through hole, the first support wall and the second support wall support the base thereon, the second through hole is aligned with the first through hole through the second cutout, the insert portion is received in the first cutout and the third cutout;

a linking post is located in the first through hole, the second cutout, and the second through hole to secure the linking member between the first frame pole and the second frame pole; and a support pole comprising an insert hole, and the support pole is located in the first cutout and the third cutout to have the insert portion inserted in the insert hole.

2. The rack frame assembly of claim 1, further comprising a bent piece, wherein the bent piece is mounted to a junction portion of the first frame pole and the second frame pole.

3. The rack frame assembly of claim 1, wherein the first frame pole comprises a first bottom wall that is parallel to the first support wall, the first bottom wall is located below the first support wall, and the first through hole is defined in the first bottom wall.

4. The rack frame assembly of claim 1, wherein a diameter of the first through hole is larger than that of the second through hole.

5. The rack frame assembly of claim 4, wherein the linking post comprises a first post portion and a second post portion, a diameter of the first post portion is substantially equal to that of the first through hole, and a diameter of the second post portion is substantially equal to that of the second through hole.

6. The rack frame assembly of claim 5, wherein the linking, post further comprises a head that is connected to the first post portion, the head is secured to the first frame pole.

7. The rack frame assembly of claim 1, wherein the insert portion and the insert hole are "L"-shaped.

8. A rack frame assembly comprising:

a first frame pole comprising a first top wall, a first support wall, and a first bottom wall; the first top wall, the first support wall, and the first bottom wall are separated from each other and parallel to each other, the first support wall is located between the first top wall and the first bottom wall, the first bottom wall defines a first through hole, the first top wall defines a first cutout, the first support wall defines a second cutout; the first cutout and the second cutout are aligned with the first through hole to expose the first through hole, a second frame pole comprising a second top wall and a second support wall, the second top wall defines a third cutout, the second frame pole is perpendicularly connected to the first frame pole, the first support wall and the second support wall are located in a first plane, the first top wall and the second top wall are located in a second plane which is located above the first plane;

a linking member comprising a base and an insert portion connected to the base, the base defines a second through hole, the first support wall and the second support wall support the base thereon, the second through hole is aligned with the first through hole through the second cutout, the insert portion is received in the first cutout and the third cutout;

a linking post is inserted in the first through hole, the second cutout, and the second through hole to secure the linking member between the first frame pole and the second frame pole; and a support pole defines an insert hole, the support pole is located in the first cutout and the third cutout to have the insert portion inserted in the insert hole.

9. The rack frame assembly of claim 8, further comprising a bent piece, wherein the bent piece is mounted to a junction portion of the first frame pole and the second frame pole.

10. The rack frame assembly of claim 8, wherein a diameter of the first through hole is larger than that of the second through hole.

11. The rack frame assembly of claim 10, wherein the linking post comprises a first post portion and a second post portion, a diameter of the first post portion is substantially equal to that of the first through hole, and a diameter of the second post portion is substantially equal to that of the second through hole.

12. The rack frame assembly of claim 11, wherein the linking post further comprises a head that is connected to the first post portion, the head is secured to the first frame pole.

13. The rack frame assembly of claim 8, wherein the insert portion and the insert hole are "L"-shaped.

* * * * *